United States Patent [19]

Peil

[11] 4,025,871

[45] May 24, 1977

[54] AUDIO AMPLIFIER FOR INTEGRATED CIRCUIT FABRICATION HAVING CONTROLLED IDLING CURRENT

[75] Inventor: William Peil, North Syracuse, N.Y.

[73] Assignee: General Electric Company, Syracuse, N.Y.

[22] Filed: June 26, 1975

[21] Appl. No.: 590,767

Related U.S. Application Data

[63] Continuation-in-part of Ser. No. 435,450, Jan. 22, 1974, abandoned.

[52] U.S. Cl. .................................. 330/22; 330/15; 330/17; 330/28; 330/30 D
[51] Int. Cl.² .............................................. H03F 3/04
[58] Field of Search .................. 330/13, 14, 15, 17, 330/18, 19, 22, 28, 30 D

[56] References Cited

UNITED STATES PATENTS

| | | |
|---|---|---|
| 3,416,092 | 12/1968 | Frederiksen ...................... 330/28 X |
| 3,462,698 | 8/1969 | Yagher, Jr. ........................... 330/15 |
| 3,569,849 | 3/1971 | Cassidy ........................ 330/30 D X |
| 3,870,965 | 3/1975 | Frederiksen .................. 330/30 D X |
| 3,914,703 | 10/1975 | Stauffer ............................ 330/13 X |
| 3,916,331 | 10/1975 | Schenck .......................... 330/18 X |

*Primary Examiner*—Rudolph V. Rolinec
*Assistant Examiner*—Lawrence J. Dahl
*Attorney, Agent, or Firm*—Marvin A. Goldenberg

[57] ABSTRACT

An audio amplifier is described designed for integrated circuit fabrication and having controlled idling current. The amplifier includes a pre-amplifier designed to be driven from an AM or FM detector or a high impedance ceramic cartridge. The powder amplifier has a pair of like conductivity type output transistors connected in push-pull and driven by a novel interstage driver whose circuit configuration and component parameters are selected to reduce the idling current to a small predictable value. Measures are further provided, including two feedback paths, for insuring stability, minimizing distortion and hum. The amplifier is executed in an integrated circuit format with a minimum of outboarded components and a minimum "pad" requirement.

21 Claims, 5 Drawing Figures

AUDIO AMPLIFIER FOR INTEGRATED CIRCUIT FABRICATION HAVING CONTROLLED IDLING CURRENT

This is a continuation-in-part of application, Ser. No. 435,450 filed Jan. 22, 1974, now abandoned.

BACKGROUND OF THE INVENTION

1. Field of the Invention

The present invention relates to audio amplifiers wherein improved means have been provided for reducing idling current, insurring stability, minimizing distortion and hum. The invention also relates to the integrated circuit (IC) fabrication of such amplifiers, wherein increasing complexity on the "chip" and decreasing complexity off the chip is favored, together with a minimum pin count.

2. Description of the Prior Art

Audio amplifiers have been fabricated for some time using solid state elements. With the advent of integrated circuits, the use of discrete transistors has tended to decline.

Once a decision to integrate has occurred, then fresh considerations obtain. Normally, integration should go as near to completion as possible. By comparison, outboarded components are more expensive and requiring additional pads which are also expensive should be minimized. Feedback loops, if possible, should remain on the chip to minimize both outboarded components and the pad count. Since the package tends to have a restricted heat dissipation capability any reduction in average dissipation will permit the amplifier to produce greater peak output signals. In addition, since many integrated circuit devices now find their way into battery operated devices, any reduction in average dissipation will substantially extend battery life.

In addition to the foregoing objectives having more direct application to integrated circuit considerations, the amplifier should have the usual performance requirements of high stability irrespective of the nature of the load presented by the loudspeaker, low distortion, low hum and adequate sensitivity to be driven by customary sources of audio signals. Such sources in most frequency usage are of course the detectors of AM-FM receivers and ceramic cartridges.

Integrated audio amplifiers are presently available. When operating at about a watt peak output, they normally use push-pull output stages, and degenerative feedback for assorted purposes. Most that are known, however, have reached a less than optimum solution to the other objectives herein outlined.

SUMMARY OF THE INVENTION

Accordingly, it is an object of the present invention to provide an improved audio amplifier.

It is a further object of the present invention to provide an audio amplifier wherein improved means are provided for achieving low predictable idle currents.

It is another object of the present invention to provide an improved audio amplifier adapted for integrated circuit fabrication.

It is a further object of the present invention to provide an audio amplifier adapted for integrated circuit fabrication and having minimum heat dissipation.

It is an additional object of the present invention to provide an audio amplifier adapted for integrated circuit fabrication and having a minimum pad requirement.

These and other objects of the invention are achieved in an audio amplifier, preferably integrated, comprising a constant current source, and a push-pull output stage comprising a first and a second output transistor of a first conductivity type connected in a base input configuration with the emitter of the second output transistor being returned to said common terminal and the audio output being taken at their interconnection. A driver stage is provided comprising a third transistor of the first conductivity type. It is connected as an emitter follower and is d.c. coupled to the base of the second output transistor. An intermediate driver is provided for coupling the output from the third transistor to the base of said first output transistor comprising a fourth and a control means which includes a fifth transistor. The fourth transistor is also of the first conductivity type and has its base electrode d.c. coupled to the emitter of the third transistor and its emitter common, thus paralleling its input junction with the second transistor to stabilize their current ratios. The fifth transistor is of a second conductivity type, having its base electrode coupled to the collector of the fourth transistor and having its emitter coupled to the constant current source and to the base of said first output transistor. The collector electrode of the fifth transistor may be coupled to a common terminal or, as in the present embodiment, to the output connection. When the foregoing measures are employed, the idling current of the first and second output transistors is controlled.

Resistance means are provded shunting the input junction of the fifth transistor for setting its operating point at current levels several times that of its beta peak, so as to fix its current level in primary dependence upon its electrode area.

Degenerative feedback is provided between said output connection and the base of said third transistor to reduce a symmetry in the gain characteristics and to achieve stability thrugh miminum phase distortion is said feedback loop.

In accordance with a further aspect of the invention, a pre-amplifier is provided comprising a differential amplifier having separate "regenerative" and "degenerative" inputs, and it supplies its output to the base of the third transistor. A second feedback is added, coupled from said output connection to said degenerative input to further reduce a symmetry in the gain characteristic and to improve amplitude linearity.

In addition, means are provided for stabilizing the d.c. idling voltage and the audio signal swing about said idling value at said output interconnection at approximately half the bias voltage, and a hum reducing capacitor is provided, coupled through an isolating resistance to the degenerative input of the pre-amplifier.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings in which:

DESCRIPTION OF THE PREFERRED EMBODIMENT

Figure 1:
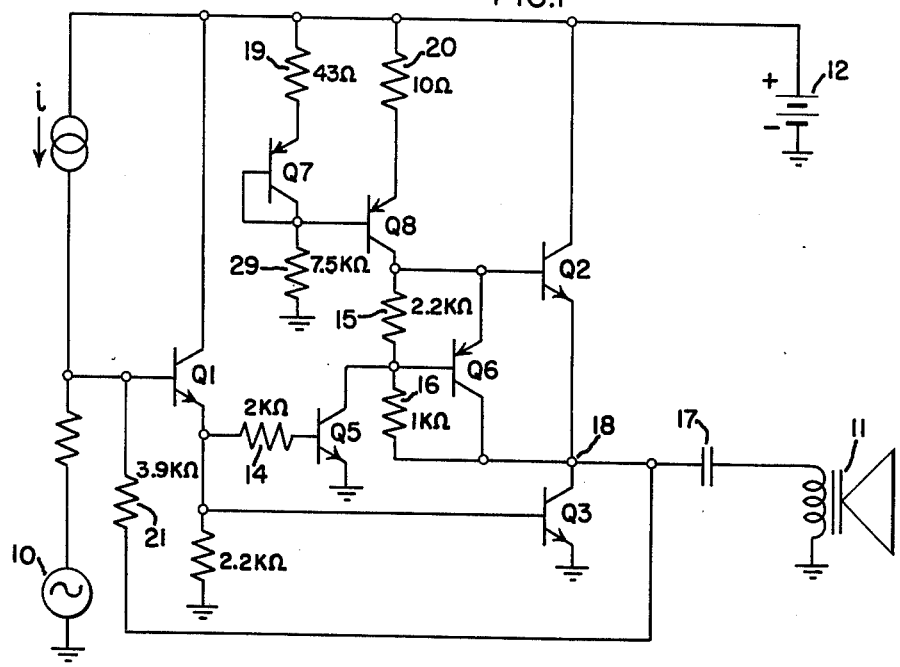
FIG. 1 is a slightly simplified circuit diagram of the push-pull output stages and driver circuitry forming the power amplifier of an audio amplifier.
Figure 2:
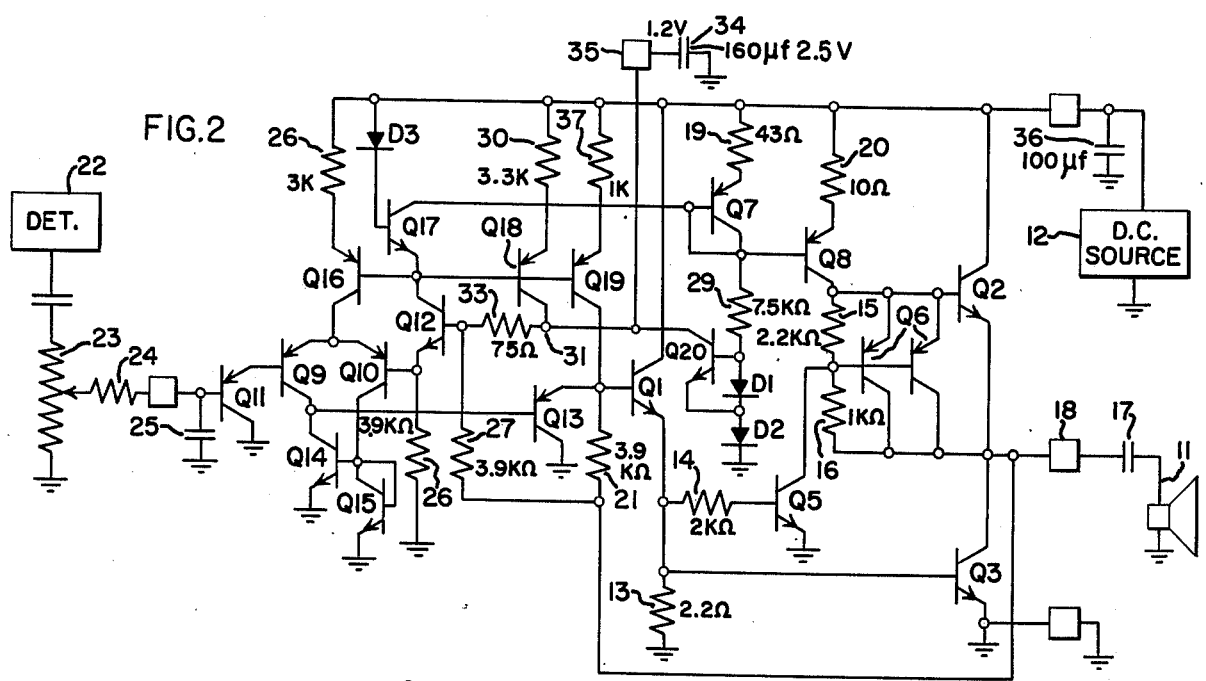
FIG. 2 is a second circuit diagram of a total audio amplifier suitable for use in a home radio receiver incorporating the push-pull output stages and driver circuitry of FIG. 1 and including pre-amplification.

A complete circuit diagram of an audio amplifier of a radio receiver in accordance with the invention is shown in FIG. 2. A slightly simplified schematic diagram of the power amplifier is shown in FIG. 1. The power amplifier incorporates the push-pull output stages and the driver circuitry. FIG. 1 illustrates those novel measures by which the idling current of the output stages is established at low value relative to the peak currents of the amplifier.

The power amplifier has as its principal components an emitter follower driver employing an NPN tranistor Q1 to which medium level audio signals are applied from audio signals source 10; a push-pull power amplifier employing NPN transistors Q2, Q3, normally operating class B, the latter (Q3) being directly driven by Q1, and the former (Q2) being driven through cascaded first and second transistors Q5 and Q6, of NPN and PNP conductivity types, respectively, a constant current source comprising the transistors Q7, Q8; an a.c. coupled loudspeaker 11 forming the load for the push-pull amplifier; and a source 12 of d.c. bias potentials.

The signal paths for the power amplifier will now be described. A source 10 of audio signals is coupled to the base of NPN driver transistors Q1 which drives both NPN push-pull output stages. The collector of Q1 is coupled to the positive bias source 12, and the emitter of transistor Q-1 is coupled to ground through load resistance 13. The emitter of Q1 is directly connected to the base of the lower push-pull output transistor Q3 and supplies a non-inverted driving signal thereto.

The upper push-pull output transistor Q2 is driven by Q1 through the two intermediate stages employing Q5 and Q6. The emitter of NPN transistor Q1 is coupled though resistance 14 to the base of NPN transistor Q5. Transisotr Q5 is in the common emitter configuration, is normally biased for class B operation, and produces an inverted ouptut signal at its collector. That output signal is coupled to the base of PNP transistor Q6. Serially connected resistances 15 and 16, respectively, shunt the input and output junction of Q6. The emitter of Q6 is coupled to the collector of the transistor Q8 (from which a constant current is derived) and to the base of Q2. The PNP transistor Q6 is in what may be regarded as an emitter follower configuration, coupling the inverted input signal applied to its base via its emitter to the base of Q2.

The push-pull output stage comprises the pair of NPN power transistors Q2, Q3 coupled in series between B+ and ground, and having the loudspeaker load coupled to their mid-point. The input biasing conditions, not yet fully described, provide for class B operation of the output stages at normal battery voltages, with each power transistor alternately conductive and quiescent. The collector of Q2 is connected to the positive terminal of the positive bias source 12, and th emitter of Q2 is connected to the collector of lower push-pull transistor Q3. The emitter of Q3 is grounded as is the negative terminal of the bias source 12. The connection of the emitter of Q2 to the collector of Q3 becomes the terminal (18) for load connection to the push-pull amplifier. The amplifier load comprises the loudspeaker 11 having one terminal connected to ground and the other terminal coupled through capacitor 17 to the amplifier output terminal 18. Finally, a degenerative audio signal feedback connection introduced both for signal linearity and stability is provided from the amplifier output terminal 18 through resistance 21 to the base of driver transistor Q1.

The input biasing conditions for the amplifier are established by the constant current source Q8, the sundry circuit connections noted, and certain constructional features to be elaborated below.

The constant current source has an internal current reference and a controlled source of current. The current reference comprises the diode connected PNP transistor Q7, having its emitter coupled through resistance 19 (43 ohms) to the positive bias source 12, its base and collector interconnected and led serially through resistance 29 (7.5K ohms) to ground. The controlled source of current comprises PNP transistor Q8, having its emitter coupled through resistance 20 to the positive source 12, its base coupled to the collector-base connection of Q7, and the collector, from which the constant current is derived, connected to the common connection of resistance 15, the emitter of Q6, and the base of Q2. As will be further detailed, the geometry of Q7 and Q8 are carefully controlled so that Q8 maintains current at a substantially fixed multiple of the current in reference Q7.

The amplifier of FIG. 1 provides both low distorton, high stability and maximum power output in an integrated circuit format. In the matter of signal amplification, the power amplifier has adequate gain to operate upon a pre-amplified signal from an AM-FM detector, and to produce adequate audio power to drive a conventional loudspeaker. Depending upon B+ supply, the undistorted power output may lie in the range of from 150 milliwatts to 1 or 2 watts (depending upon packaging) before heat dissipation sets an upper limit for audio power. (Saturation limits are normally slightly higher or may be so made by adjustment of electrode areas.)

The basic amplifier, as so far described, has distinctly different properties of amplification, as between the positive and negative half cycles of the audio signal, but excellent phase response and stability. The gain from driver stage Q1 to the lower power transistor Q3, may be regarded as near unity, while the gain from driver stage Q1 to the upper power transistor Q2, involving two intermediate stages of amplification, is potentially very high.

Figure 3:
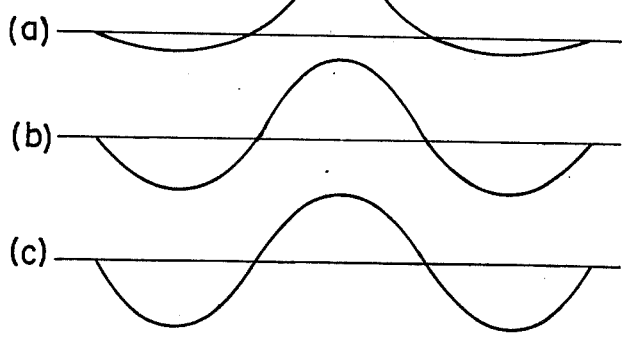
FIGS. 3a, 3b and 3c are three waveforms descriptive of the operation of the power amplifier illustrated in FIG. 1.

The imbalance is illustrated in FIG. 3(a). While amplitude distortion may be present, the power amplifier configuration has intrinsically good phase properties through the audio spectrum and well into the microwave region. The input drive to the upper stage involves only a pair of emitter followers (Q1, Q6) and a single phase inverter (Q5), while the lower stage requires only the emitter follower Q1, already noted, and no further phase inversion. The emitter followers may be designed for low phase shifts, and where at most, a single phase inversion is involved, the differential and accumulated phase shifts are very small.

The amplitude distortion and residual instability are controlled by the provision of feedback and high frequency roll off. The feedback is provided from 18 to the input of the driver stage through resistance 21. It is degenerative in phase and has the effect of very substantially reducing the amplitude asymmetry of the waveform. It reduces measured distrotions to a few percent. The improved waveform resulting from this feedback path is illustrated in FIG. 3(b).

A second effect of this short, first feedback path is to assure the overall stability of the amplifier under all signal and load conditions. Transistor Q1, being an emitter follower and of smaller size, is of higher frequency response than the output transistor Q3, which has large parasitic capacitances. Q3 therefore introduces the dominant roll-off generally precluding high frequency instability in the lower part of the amplifier. The gain is relatively low and instability is not particularly severe in the lower portion of the amplifier. With respect to the upper portion of the amplifier, which is of higher gain, feedback from the first loop is normally adequate to avoid instability, but may be supplemented by the resistance 14 (2.0K), which with the "miller," or collector-base, capacitance of Q5, produces appreciable roll-off in the intermediate driver amplifiers to further reduce any tendency to instability. With feedback, the foregoing circuit will function with a capacitively coupled loudspeaker, and remains unconditionally stable at higher audio frequencies as the loudspeaker load becomes increasingly inductive. The circuit achieves complete stability without the need for the customary phase compensating elements in the load circuit to offset this reactive component.

The embodiment illustrated in FIGS. 1 and 2 achieves very substantial audio output power in the face of very modest input power dissipation levels. Assuming a biasing voltage of 6 volts, the foregoing amplifier permits "undistorted" peak audio currents of one-half ampere, while requiring an idling current of only 6 or 7 miliamperes. These and other advantages flow from the intrinsic nature of the circuit, and from certain constructional features realized in an integrated circuit format, which will now be described.

The foregoing circuit configuration makes the idling current setting of the push-pull output stage dependent on three principal factors which can be carefully controlled during integrated circuit processing. These factors are the current setting of the constant current source Q8, the ratio of currents between transistors Q3 and Q5; and the beta of transistor Q6. These factors are dependent on the areas of the active circuit devices. In normal processing and depending on size, these areas can be controlled to accuracies of a percent or less. How these factos are controlled and how the circuit forces depend upon these factors will now be described.

The constant current source PNP transistor Q8 provides a stable current setting, deriving its current reference from transistor Q7. Transistor Q7 is a laterally deposited PNP transistor, diode connected, with the emitter separate and the collector and base joined. The junction of Q7 carefully replicates the junction of the controlled current source Q8 except for the relative areas of the active regions. Q8 is also laterally deposited. While Q7 is formed of two "disks," Q8 is formed of 18 disks. This produces a relative ratio of areas between the two transisors of 9 to 1 but in practice the actual current ratios are slightly less, being apprxiamtely 8 to 1.

The circuit configuration, in that both input junctions are electrically paralleled, forces the currents into a fixed relative relationship. Thus, the emitter of Q8 is led though a low valued resistance 20 (10 ohms) to the positive bias source while the emitter of Q7 is led to the same source through a low valued resistance 19 (43 ohms), thus holding the emitters at nearly the same voltage. Since the bases of both transistors are joined, the Veb's of both input junctions are equalized. The values of 19 and 20 are tailored to minimize the effects of mismatches between the active devices.

The parallel circuit connection thus forces any current flowing in Q7 to be replicated in Q8 in substantial proportion to the relative areas of Q7 and Q8. The current of Q7, which is the primary reference, is dependent upon the bias voltage and series resistance 29. The value of resistance 29 establishes the reference current in Q7. Assuming fixed bias voltages, the current of constant current source Q8 is thus primarily dependent upon the current in Q7, and the relative areas of the two devices. These areas are controllable to a few percent.

The current ratio between transistors Q3 and Q5 may be maintained at a constant value by a similar control of the areas of the respective devices. Transistors Q3 and Q5 are NPN transistors. (Assuming that the substrate is selected for NPN processing, they are not laterally developed.) The circuit configuration parallels the input junctions of Q3 and Q5 and forces their Veb's into substantial correspondence. The emitters of both transistors Q3 and Q5 are grounded while their bases are interconnected by the 2000 ohm resistance 14. This resistance is small in terms of base current, allowing the bases of the two transistors, and thereby both input junctions to have substantially equal potentials. With the Veb's equalized, the current ratio between Q5 and Q3 then becomes a function of the relative areas of their respective electrode regions. Typically, the area of trasistor Q5 is arranged to be one-fifth that of the area of Q3 so as to fix the current ratio at approximately this same value.

A further element in establishing the idle current setting of the push-pull amplifier is the beta of transistor Q6. Transistor Q6 is a laterally developed PNP transistor having a reduced area inrelation to its operating current level so that it operates well off the beta peak of the transitor. At a 5 milliampere operating point, the beta is adjusted from a B peak of about 30 to approximately 4. Assuming the foregoing current levels, one should employ a transistor whose beta begins to fall off at about one-half milliampere.

The circuit configuration and circuit values are accordingly chosen to cause transistor operation in the current regions where the beta tends to stabilize. When this occurs, the beta assumes an arbitrary number, substantially independent of all factors, save for the area of the device.

The circuit connections involving Q6, Q2, Q8 are one of the last two factors which determine the idling current settings of the amplifier. The emitter of PNP transistor Q6 is coupled to the base of NPN transistor Q2 and the base of transistor Q6 is connected through resistance 16 (1000 ohms) to the emitter of Q2. By virtue of the substantial equality in the Veb's of Q6 and Q2, the potential at the base of Q6 is substantially equal to the potential at the emitter of Q2. Thus, the voltage across resistance 16 is small and the current therein negligibly small. The circuit configuration and values thus establish the division in current supplied from the collector of Q5 between resistance 15 and the base of Q6. Assuming resistance 15 is 2.2K ohms, and typical emitter junction voltages, 0.4 of a milliampere flows in R15 and the balance of the collector current flows into the base of Q6.

The effect of the foregoing assumptions may now be described in an approximate calculation. Let us assume that a collector current of 6 milliamperes is a satisfactory level for the idling current of Q3. Assuming that Q5 and Q3 have relative areas of 5 to 1, the collector current of Q5 will be approximately one-fifth that in Q3 or 1.2 mils. The resistance 15 of the voltage divider and the base of Q6 then conducts the 1.2 milliamperes of current supplied from Q5. Typically, resistance 15 carries 0.4 milliamperes and 0.8 milliamperes are injected into th base of Q6. If the beta of Q6 is 5, its collector current is 4 mils and its emitter current is 4.8 mils. The current available for the base of upper push-pull amplifier Q2 is equal to the current available from constant current source Q8 (assumed to be 5 milliamperes), less the current in resistance 15 and less the emitter current of Q6. Thus, when the emitter current in Q6 and the current in resistance 15 are properly established, the base current injeted into Q8 is held to a low constant value. From the values so far assumed, the demands of current for Q6 and resistance 15 exceed that available from the constant current source and thus both the current in Q2 and Q6 are reduced correspondingly.

The final circuit factor in determining the idling current setting of the amplifier is the connection of the emitter of transistor Q2, the collector of Q6 and the collector of Q3 to the output point 18. By this connecton, the collector current in Q3 is forced into (substantial) equality with the current for Q6 and Q2. Assuming Q3 to be set at 6 milliamperes, Q6 at 4.8 milliamperes, then only 1.2 milliamperes of current is available at the emitter of Q2. The foregoing numbers are approximations and, in practice, the collector current of Q3 is established in the range of from 6 to 8 milliamperes, the emitter of Q2 in the range of from 1 to 3 milliampreres and Q6 from 3 to 5 milliamperes.

The configuration of FIG. 1 represents a simplified embodiment that may be readily refined to achieve excellent overall performance. The FIG. 1 version has a very stable idling current, high stability and an amplitude distortion of a few percent. The distortion figure is adequate for many applications but can readily be improved by additional feedback. The d.c. voltage balance of the amplifier at crossover is approximately fixed by the idling current provisions just described. Since the d.c. balance at 18 is defined by what may be regarded as two series connected constant current souces (Q7, Q8 and emitter follower Q3), the d.c. output voltage is indeterminate to a degree. Accordingly, if one wishes to constrain the quiescent point of the amplifier to a fixed value, or bound the a.c. swings, or to further reduce the distortion, a second feedback loop, and certain other features may be incorporated into the design. These will now be described.

In the embodiment of FIG. 2, a full audio amplifier is shown, including pre-amplification of the audio signal and a power amplifier similar to that in FIG. 1, but having a second feedback loop. Elements in the power amplifier repeated from FIG. 1, bear the same reference numerals in FIG. 2. The pre-amplifier has as its components a differential amplifier comprising PNP transistors Q9, Q10, associated PNP and NPN driving transistors Q11, Q12, a single PNP output transistor Q13; current "turn around" transistors Q14, Q15 and transistors Q16 through Q20; diodes D1 through D3; and sundry resistances which enter into the biasing provisions for the pre-amplifier and the power amplifier.

The amplifier amplifies an input signal as follows: As shown in FIG. 2, the input source for the amplifier is a detector 22. Typically, it is an FM or an AM detector or a detector combining both modes of detection. The detector 22 is coupled through a capicitor to a volume control potentiometer 23. One terminal of the potentiometer is grounded and audio signals from the tap are supplied through resistance 24 to the base of emitter follower transistor Q11. A radio frequency by-pass condenser 25 couples the base of Q11 to ground. The collector of Q11 is grounded and its emitter, from which the output signal is derived, is coupled to the base of transistor Q9 of the differential pair Q9, Q10. The base of Q10 is not directly coupled to the input source, but as will be seen, is an input point for degenerative feedback. The emitters of Q9, Q10 are joined and receive their current through the collector of current source transistor Q16. Q16 has its emitter led through a 3000 ohm resistor 26 to the positive source of bias potentials 12. Audio signals directly amplified from the detector thus appear at the collector of Q9. As will be seen, signal components injected by the feedback loop also appear at the collector of Q9.

A second input to the differential amplifier Q9, Q10 is a feedback connecton made from the amplifier output to Q12. Q12 is an NPN transistor in emitter follower configuration on what may be regarded as the degenerative side of the input differential amplifier. Output signals from the power amplifier are coupled from the output terminal 18, through resistance 27 to the base of Q12. The collector current of Q12 is supplied from the emitter of current source transistor Q17. (The connections to the base and collector of Q17, which establish its current level, will be treated subsequently). The feedback signal appearing at the emitter of Q12 is fed to the base of Q10 of the differential pair. A resistance 26 coupled between the emitter of Q12 and ground is the signal load. The feedback signal so applied to the base of Q10 appears at the emitter of Q10, and is coupled from the emitter of Q10 to the emitter of Q9. At the collector of Q9, the feedback adds degeneratively to the initial input signal.

A directly amplified feedback signal also appears at the collector of Q10 and is coupled via a current "turnaround" into the output of Q9, where it enters the forward gain path of the amplifier. The current turnaround comprises transistors Q14 and Q15. The collector of Q10 is coupled to the base-collector connection of diode connected transistor Q15 on the input side of the turn-around. The emitter of Q15 is grounded. The junction of Q15 is pralleled with the input junction of Q14; the base of Q14 being coupled to the collector-base of Q15, and the emitter of Q14 being grounded. Thus, a current replicating that flowing in Q10 from the feedback source appears at the collector of Q14, and is also added to the signal appearing at the collector of Q9. The effect is to further augment the degenerative action.

A composite audio signal, including both the direct and the feedback signals from the two paths outlined, thus appears at the collector of Q9 and is applied to the base of output emitter follower Q13. The collector of Q13 is grounded and its emitter current is supplied from the collector of another current source, transistor Q19. Q19 has its emitter coupled to the B+ source through a resistance 37, and its base coupled to a bus common to the base of current source Q16, the emiiter of Q17, and the base of current source Q18 (so far not described). The output signal appearing at the emitter of Q13 is coupled to the base of driver transistor Q1. Driver transistor Q1 drives the output push-pull amplifiers Q2, Q3, in the manner already described.

The differential input amplifier operates at a very high impedance level and employs a substrate PNP and a laterally formed PNP transistor in a Darlington configuration. The stage is therefore of intrinsically high gain and can accept substantial amounts of degenerative feedback. The circuit values indicated provide for stable amplification.

The feedback connection completed from the output power amplifier to the input pre-amplifier supplements the feedback connection earlier noted in the power amplifier and improves the linearity of audio amplification to a fraction of a percent. The d.c. balance may however be still less than ideal unless other measures are undertaken. An imbalance of 3 to 2 in peak currents is typical.

The means for balancing the output will now be described. As previously noted, the d.c. idling voltage at the output (18) of the push-pull amplifiers is indeterminate, being the result of two serially connected current sources. The idling voltage and the magnitude of the a.c. signal swings is set by means of resistance 27, transistor Q20, current source transistor Q7, resistance 29, diodes D1 - D3 and current source Q18. By these means, the voltage (at the output point 18) is set at a desired voltage, normally, slightly below the half-way point between the positive potential of source 12 and ground. This is achieved by making resistance 27 equal to approximately one-half the value of resistance 29, and by control of the current in constant current source 18.

The idling voltage (V18) at the output point of the amplifier may be calculated as follows. The collector of Q20 may be regarded as connected to a current node (point 31). Regarded as a current node, the sum of the currents toward and away from the node equal zero. More particularly, the current drawn away from the node by the collector of Q20, the current approaching the node through resistance 27 from the output point 18 of the amplifier, and the current approaching the node from the emitter of constant current source transistor 18 may be equated as follows:

$$I_{c_{20}} = I_{c_{18}} + I_f \quad (1)$$

where
$I_{c_{20}}$ = collector current from reference Q20,
$I_{c_{18}}$ = collector current from reference Q18, and
$I_f$ = current in feedback resistance 27.

Increasing the current flow in the feedback resistance raises the idling voltage. Since that current is supplied from the collector current Q20, increasing the collector current in Q20 has a like effect upon the idling voltage (V18).

The current at the collector of Q20 replicates the current in the serially connected diode D1, which flows under the influence of B+ less three diode drops (input junction of Q7, D1, D2) through the resistance 29 of 7.5K.

$$I_{c_{20}} = \frac{B+ - 3Vd}{7.5K} \quad (2)$$

The current in Q18 is determined by the voltage across resistance 30 and the magnitude of that resistance. The voltage drop in resistance 30 is equal to the drop across diode D3, which is forward biased, and the input junction to Q17, less the voltage drop across the input junction Q18. Since diode D3 is forward biased with a small current, its drop is lowered slightly to approximately one-half volt. The current in Q18, assuming a voltage drop of 0.5 volts across emitter resistance 30, $$I_{Q18} = \frac{0.5}{3.3K} \quad (3)$$

The current in the feedback resistance 27 is a function of the voltage (V18) at the amplifier output, the voltage at the node (31), and inversely proportional to feed-back resistance 27. The voltage at the node 31 is the result of successive input junction drops "Vd" (Q11, Q9, Q10, Q12), commencing from the grounded terminal of potentiometer 24. The polarity of the voltage drops in the input junctions are successively positive for Q11, positive for Q9, negative for Q10, positive for Q12, leaving a net of two positive junction drops, and a value of 1.2 volts (approximately). Therefore, $I_f$ may be calculated as follows:

$$I_f = \frac{V_{18} - 1.2}{3.9K} \quad (4)$$

Substituting into equation (1)

$$I_f = I_{c_{20}} - I_{c_{18}} \quad (5)$$

$$= \frac{B+ - 3Vd}{7.5K} - \frac{0.5}{3.3K} \quad (6)$$

Solving for V18 by setting equation (4) equal to equation (6):

$$\frac{V_{18} - 1.2}{3.9K} = \frac{B+ - 3Vd}{7.5K} - \frac{0.5}{3.3K} \quad (7)$$

to obtain V18:

$$V_{18} = 3.9K \frac{B+ - 3Vd}{7.5K} - \frac{0.5}{3.3K} + 1.2 \quad (8)$$

Assuming B+ = 6 volts; $Vd = 0.7$ $$V_{18} = 3.9K \frac{6 - 2.1}{7.5K} - \frac{0.5}{3.3K} + 1.2 \quad (9)$$

$$V_{18} = +2.64 \text{ volts}$$

The value for V18 may be shifted by adding or removing diodes in series with Q7 or by adjusting the current into Q18. The desired value of V18 is slightly below half the d.c. voltage because the emitter saturating characteristic of lower push-pull transistor Q3 is not symmetrical with the collector saturating characteristic of transistor Q2. Thus, it is preferred that the positive swings remains about 1 volt below B+ at 6 volts bias, and about one-fourth volt above ground for negative swings. An effect of the foregoing centering configuration is that when the B+ is increased above a normal value of about 6 volts, that the output stages shift from class B operation toward class A. This effect decreases the power efficiency of the amplifier, producing further improvements in fidelity and more particularly a substantial reduction in cross over distortion.

In addition to providing an accurate control of the centering of the push-pull output amplifier, the configuration of FIG. 2 also provides both appreciable hum suppression and substantial d.c. stability. These last two measures are achieved in a particularly economic fashion. As shown in FIG. 2, the collector of Q20 at node 31 is coupled to an external pad 35, to which a capacitor 34 is attached. This capacitor has a large value (160 μf) at a low voltage (2.5 volts). This value provides a low impedance at 60 cycles and provides appreciable hum suppression. Introduced between capacitance 34 and the base of Q12 is a small (75Ω) resistance which together with capacitor 34 permits the closed loop gain of the amplifier to remain high for a.c. signals and low, with large amounts of degeneration, for stable d.c. operation.

Assuming that the bias source (12) for the amplifier is derived from a 60 cycle line voltage and rectified and filtered, one may expect some a.c. ripple to be superimposed upon the d.c. output voltage. One may control the ripple by use of large capacitances such as capacitor 36 shown in shunt with the bias source, and by multiple section RC filters. In general, one does not try to eliminate such ripple, but only to reduce it to tolerable limits consistent with other requirements.

In the present arrangement, a modified approach to filtering is provided. In a conventional push-pull amplifier using non-complementary power transistors, the ripple is applied to the collector of the upper push-pull amplifier. Assuming a centrally coupled load and equal voltage division between transistors, one may expect the ripple to appear in the load (at one-half its voltage at the bias source), and produce hum in the output loudspeaker. In the present arrangement, the d.c. balancing circuit injects current from Q20 into the node at 31 to hold the d.c. potential at 18, at a predetermined near central voltage position. The current injection by Q20, assuming that capacitor 34 and resistor 33 are not present, however is based on the instantaneous current from D1, and this in turn is a function of the total d.c. potential including the ripple from the d.c. source 12. Capacitor 34 filters the ripple (hum) which is present in the 7.5 K resistor (29) and arrives via the turnaround (Q20). Node 31 can therefore be assumed to be hum free and thus the references against which both feedback loops work are hum free. The current in the 7.5 K resistor (29) which gets turned around in Q7, Q8 contains hum and perturbates the normal 5 milliampere idle current. This perturbation, however, is lessened by the gain in both loops and generally reduces the "hum" down to the noise. Typical hum reduction is 60 db.

A second effect of the components 33 and 34 is in the excellent d.c. stability that may be obtained. The circuit means including capacitor 34 and resistance 33 at the degenerative input to the amplifier permits a differential degenerative feedback as between a.c. and d.c. gain in the amplifier. For a.c. purposes, the degenerative feedback is determined by the relative size of resistance 33 to the complex impedance of resistance 27 and capacitor 34. The values are normally selected to produce a small feedback ratio so as to permit high closed loop, a.c. gain. For d.c., the impedance of capacitor 34 is infinite, and the feedback ratio is essentially unity, very substantially lowering the d.c. gain and insuring the desired high stability operation.

A further feature of the embodiment illustrated in FIG. 2 is the means by which the current supplied to the pre-amplifier stages is isolated from the current demands of the output stages. The network for establishing the base potentials on current source transistors Q10, Q18, Q19 is Q17, whose emitter is coupled to all three bases and to the collector of Q12. The base of Q17 is returned through diode D3 to B+ where it is held at a nearly fixed d.c. value below the bias potential. The collector of Q17 is coupled to the collector-base junction of current reference transistor Q7. The emitter current for Q17 is derived from the collector current of Q12 which has a constant emitter current established by the resistance 26 and the fixed voltage across resistance 26. The latter voltage is fixed at a single diode drop above ground potential by the interconnected input junctions of Q11, Q9, Q10. Resistance 26 establishes a minimum current in the series path including Q12, Q17 and Q7, and sets a minimum current drain for Q7. The bases of Q16, Q18 and Q19 being coupled to the emitter of Q17, are thus generally isolated by the transistor Q17 from any excess current demands from Q8 or Q20 that might appear at its collector.

In summary, the inventive embodiment has a very low predictable idle current. That idle current is determined by the geometry, i.e. areas, of the respective devices and thus can be controlled to a high degree of accuracy when the "masks" for device formation are originally made. The amplifier is particularly economical in its use of external components. Thus, while it employs two feedback loops, these loops are on the "chip," and do not require additional external components. Through feedback, which linearizes and stabilizes the amplifier and stabilization of the d.c. idling point, the output stages may be driven hard without excessive power dissipation or unexpected clipping. The self-centering action of the biasing arrangement permits the amplifier to be very tolerant of change in the bias voltage. The amplifier has been designed for use at 6 volts, but will operate with good linearity, but reduced power at 3 volts. It will also operate, and in fact with improved fidelity, at 12 volts. In addition, the circuit makes it possible to take maximum advantage of the available d.c. voltage supply and does so without the need for bootstrapping.

A further advantage derives from the design of the differential amplifier pre-amplifier and the indicated mode of feedback connection. This design permits the signal input to remain at a very high impedance, well above a megohm. Consequently, the pre-amplifier may not only be driven by conventional AM and FM detectors, but also by a ceramic cartridge of the conventional (∼½ volt) output voltage.

What I claim as new and desire to secure by Letters Patent of the United States is:

1. An audio amplifier having minimum idling current comprising:
A. a source of bias potentials having two terminals, one common;
B. a constant current source coupled to the non-common terminal of said source;
C. a push-pull output stage comprising: a first and a second output transistor of a first conductivity type; each connected in a base input configuration, with the collector of the first transistor being returned to the non-common terminal and the emitter of said second output transistor being returned to the said common terminal; both transistors being coupled in series across said source with the emitter of said first transistor being coupled to the collector of said second transistor, the output being taken at the interconnection of said transistors;

D. a driver stage for said push-pull amplifier comprising:
1. a third transistor of said first conductivity type for driving both output transistors, connected in base input, emitter follower configuration, means d.c. coupling the emitter of said third transistor to the base of said second output transistor;
2. an intermediate driver for coupling the output from the emitter of said third transistor to the base of said first output transistor comprising a fourth and fifth transistor,
   a. said fourth transistor being of a first conductivity type and having its base electrode d.c. coupled to the emitter of said third transistor and its emitter connected to said common terminal to parallel the input junctions of said fourth and second transistors for maintaining their respective base emitter voltage drops equal and thereby stabilize their current ratios,
   b. said fifth transistor being of a second conductivity type, having its collector coupled to said output interconnection, its base electrode coupled to the collector of said fourth transistor and having its emitter coupled to said constant current source and to the base of said first output transistor, whereby the base current level of said first output transistor, and in consequence its idling current, is limited by current available from said constant current source, but reduced by the current withdrawn by said fifth transistor, and the idling current in said second output transistor is restricted to that supplied by said first and said fifth transistors.

2. An amplifier as set forth in claim 1 wherein a tapped resistance is provided having one part shunting the input junction of said fifth transistor and the other part shunting the output junction of said fifth transistor, said tapped resistance setting the operating point of said fifth transistor at current levels several times that of its beta peak for making its current level primarily dependent upon its electrode area.

3. An amplifier as set forth in claim 1 wherein a degenerative feedback connection is provided coupled between said output interconnection and the base of said third transistor to reduce asymmetry in the gain characteristics and to achieve stability through minimum phase distortion in said feedback loop.

4. An amplifier as in claim 1 wherein said five transistors and said constant current source, itself comprising a sixth and seventh transistor, are integrated together.

5. An amplifier as set forth in claim 3 having in addition thereto:
   a. a pre-amplifier comprising a differential amplifier having separate inputs, and an output supplied to the base of said third transistor, and
   b. a second feedback means coupled from said output interconnection to the input providing degeneration to further reduce asymmetry in the gain characteristic and to improve amplitude linearity.

6. An amplifier as set forth in claim 5 wherein stabilizing means are provided for stabilizing the d.c. idling voltage and the audio signal swing about said idling value at said output interconnection, said stabilizing means including:
   a. a first resistance coupled between said degenerative input and said amplifier output interconnection to draw off a pre-determined current from said output interconnection to hold said output voltage at a desired idling value, and
   b. current withdrawal means for effecting said current withdrawal comprising a controlled current source for withdrawing current from said resistance substantially equal to that required to hold said output idling voltage at approximately half the bias voltage.

7. An amplifier as set forth in claim 6 wherein said current withdrawal means comprises:
   a. a first current reference including a resistance having approximately twice the value of said feedback resistance and a diode connected thereto in series across said bias source, and
   b. an other transistor whose input junction is in shunt with said diode, having its collector connected to said first resistance withdraw current proportional to that in said diode from said output interconnection.

8. An amplifier as set forth in claim 7 wherein current injecting means are provided comprising a further transistor having a fixed reference voltage applied to its base, a resistance coupled between its emitter and the non-common terminal of said bias source, and its collector being coupled to the collector of said other transistor, said further transistor injecting additional current at its connection point for offsetting the current from said withdrawal means and thereby setting the voltage at said amplifier output slightly under one-half the bias potential.

9. An amplifier as set forth in claim 8 wherein a small resistance is introduced between the degenerative input and the collector of said other transistor for input isolation, and a large filter capacitor is coupled to said last recited collector to reduce hum at said output interconnection.

10. An amplifier as set forth in claim 9 wherein all recited transistors are integrated together.

11. An audio amplifier having miminum controlled idling current, comprising:
   A. a common terminal and a non-common terminal for providing access to a source of bias potentials;
   B. a constant current source coupled to the non-common terminal;
   C. a push-pull output stage comprising: a first and second output transistor of a first conductivity type connected in series between said common and non-common terminals, the active region areas of said first and second transistors being approximately equal for exhibiting approximately equal current conduction characteristics;
   D. a driver stage for said push-pull amplifier, comprising:
   1. a third transistor providing a signal for driving both output transistors;
   2. means for applying the signal from the third transistor to the input of said second transistor for causing conduction therein;
   3. an intermediate driver for applying the signal from the third transistor to the input of said first transistor comprising a fourth transistor and a control means,
  a. a said fourth transistor being of said first conductivity type and having an active region area that is related to the active region area of said second transistor by a predetermined ratio, and
  b. said control means being connected to said constant current source for distributing a portion of the current from said constant current source to the output of said fourth transistor and another portion to the input of said first transistor and for withdrawing the remaining current,
  whereby the input current to said first transistor and consequently its idling current is limited by the current available from said constant current source reduced by the output current in said fourth transistor and the current withdrawn by said control means, and the idling current in the second transistor is determined by the output current in said fourth transistor, being related thereto by approximately the ratio of the active region areas beteen said second and fourth transistors.

12. An amplifier as set forth in claim 11 wherein:
a. said first and second transistors are each connected in a base input configuration, with the collector of the first transistor being returned to the non-common terminal and the emitter of said second transistor being returned to said common terminal, the emitter of said first transistor being coupled to the collector of said second transistor, the output being taken at the interconnection of the transistors;
b. said third transistor is connected in base input, emitter follower configuration, the emitter of said third transistor being d.c. coupled to the base of said second transistor;
c. said fourth transistor has its base d.c. coupled to the third transistor's emitter and its own emitter connected to the common terminal, whereby to parallel the input junctions of said fourth and second transistors for maintaining their respective base emitter voltage drops equal and thereby stabilize their current ratios,; and
d. said control means comprises a fifth transistor of a second conductivity type, having its collector coupled to said output interconnection, its base coupled to the collector of said fourth transistor and having its emitter coupled to said constant current source and to the base of said first transistor, whereby the idling current in said second transistor is supplied by said first and fifth transistors.

13. An audio amplifier having minimum controlled idling current, comprising:
A. a common terminal and a non-common terminal for providing access to a source of bias potentials;
B. a constant current source coupled to the non-common terminal;
C. a push-pull output stage including first and second output transistors of a first conductivity type connected in series between said common and non-common terminals, the active region areas of said first and second transistors being approximately equal for exhibiting approximately equal current conduction characteristics;
D. first means for providing a signal for driving both output transistors;
E. second means for applying the drive signal to the input of said second transistor for causing conduction therein, and
F. third means for applying said drive signal to the input of said first transistors, said third means including:
  1. a further transistor of said first conductivity type having an active region area that is related to the active region area of said second transistor by a predetermined ratio, and
  2. control means connected to said constant current source for distributing a portion of the current from said constant current source to the output of said further transistor and another portion to the input of said first transistor and for withdrawing the remaining current;
  whereby the input current to said first transistor and consequently its idling current is limited by the current available from said constant current source reduced by the output current in said further transistor and the current withdrawn by said control means, and the idling current in the second transistor is determined by the output current in said further transistor, being related thereto by approximately the ratio of the active region areas between said second and further transistors.

14. An amplifier as set forth in claim 13 wherein said control means comprises a control transistor of a second conductivity type.

15. An amplifier as set forth in claim 13 wherein said first and second transistors are each connected in a base input configuration, with the collector of the first transistor being returned to the non-common terminal and the emitter of said second transistor being returned to said common terminal, the emitter of said first transistor being coupled to the collector of said second transistor, the output being taken at the interconnection of said first and second transistors.

16. An amplifier as set forth in claim 15 wherein said first means includes a drier transistor connected in base input, emitter follower configuration, the emitter of said driver transistor being d.c. coupled to the base of said second transistor.

17. An amplifier as set forth in claim 16 wherein said further transistor has its base d.c. coupled to the third transistor's emitter and its own emitter connected to the common terminal, whereby to parallel the input junctions of said further and second transistors for maintaining their respective base emitter voltage drops equal and thereby stabilize their current ratios.

18. An amplifier as set forth in claim 17 wherein said control means comprises a control transistor of a second conductivity type, having its collector coupled to said output interconnection, its base coupled to the collector of said further transistor and having its emitter coupled to said constant current source and to the base of said first transistor, whereby the idling current in said second transistor is supplied by said frist and control transistors.

19. An amplifier as set forth in claim 13 wherein the output is taken at the interconnection of said first and second transistors and a degenerative feedback connection is provided coupled between said output interconnection and said first means to reduce asymmetry in the gain characteristics and to achieve stability through minimum phase distortion in said feedback connection.

20. An amplifier as set forth in claim 19 having in addition thereto:

a. a pre-amplifier comprising a differential amplifier having separate inputs, and an output supplied to said first means, and b. a second feedback means coupled from said interconnection to the input providing degeneration to further reduce asymmetry in the gain characteristic and to improve amplitude linearity.

21. An amplifier as set forth in claim 20 wherein stabilizing means are provided for stabilizing the d.c. idling voltage and the audio signal swing about said idling value at said output interconnection, said stabilizing means including:

a. a resistance coupled between the degenerative input and said output interconnection to draw off a pre-determined current from said output interconnection to hold the output voltage at a desired idling value; and b. current withdrawal means for effecting said current withdrawal comprising a controlled current source for withdrawing current from said resistance substantially equal to that required to hold said output idling voltage approximately half the bias voltage.

* * * * *